United States Patent [19]

Wu et al.

[11] Patent Number: 6,022,616
[45] Date of Patent: Feb. 8, 2000

[54] ADHESIVE COMPOSITION WITH SMALL PARTICLE SIZE FOR MICROELECTRONIC DEVICES

[75] Inventors: Bing Wu, Marina del Rey; Timothy G. Costello, Irvine; Kathy M. Jun, Cerritos, all of Calif.

[73] Assignee: National Starch and Chemical Investment Holding Corporation, Wilmington, Del.

[21] Appl. No.: 09/012,354

[22] Filed: Jan. 23, 1998

[51] Int. Cl.$^7$ ........................................................ B32B 3/26
[52] U.S. Cl. ..................... 428/320.2; 428/40.2; 428/200; 428/402; 428/325; 428/327; 252/514; 257/717
[58] Field of Search ..................... 257/717; 428/320.2, 428/40.2, 324; 252/514

[56] References Cited

U.S. PATENT DOCUMENTS

| | | | |
|---|---|---|---|
| 2,983,853 | 5/1961 | Williams | 257/717 |
| 3,526,814 | 9/1970 | Piedra et al. | 257/717 |
| 4,545,840 | 10/1985 | Newman et al. | 156/276 |
| 4,965,660 | 10/1990 | Ogihara et al. | 157/717 |
| 5,391,604 | 2/1995 | Dietz et al. | 524/403 |
| 5,488,082 | 1/1996 | Dietz et al. | 524/403 |
| 5,539,253 | 7/1996 | Nagaune | 257/717 |
| 5,552,637 | 9/1996 | Yamagata | 257/717 |
| 5,650,662 | 7/1997 | Edwards et al. | 257/717 |
| 5,721,455 | 2/1998 | Takashita | 257/717 |
| 5,770,706 | 6/1998 | Wu et al. | 523/429 |
| 5,854,315 | 12/1998 | Wu et al. | 523/427 |
| 5,856,383 | 1/1999 | Wu et al. | 523/429 |

*Primary Examiner*—Deborah Jones
*Assistant Examiner*—Cathy F. Lam
*Attorney, Agent, or Firm*—Jane E. Gennaro

[57] ABSTRACT

This invention is an improved adhesive composition prepared from at least one organic polymer resin, an inorganic filler, and a fugitive liquid, in which the liquid and organic polymer resin are each substantially insoluble in the other; and in which the improvement comprises that the at least one organic polymer resin be present in particulate form of particle size that is 25μ or smaller. Adhesive compositions so prepared can be used on dies-400 mil×400 mil or greater on metal substrates without significant delamination.

7 Claims, No Drawings

ADHESIVE COMPOSITION WITH SMALL PARTICLE SIZE FOR MICROELECTRONIC DEVICES

FIELD OF THE INVENTION

This invention relates to an adhesive composition containing small particle sizes for use in microelectronic devices.

BACKGROUND OF THE INVENTION

It has been disclosed in U.S. Pat. No. 5,488,082, that adhesive pastes for attaching silicon dies onto ceramic substrates can be prepared from at least one organic polymer resin, inorganic filler, and a fugitive liquid, in which the resin and the filler are present in particulate form of small enough size to pass through a number 325 mesh screen, and in which the fugitive liquid and organic polymer resin are substantially insoluble in each other.

The polymer is preferably a thermoplastic polymer, but may be a combination of a thermoplastic polymer and a thermoset polymer, provided that the thermoplastic nature of the blend is preserved. The maximum particle size for the organic polymer resin is that particle size that can pass through a 325 mesh screen, and preferably through a 400 mesh screen.

These paste compositions are used for attaching semiconductor chips or dies to a substrate. The paste is applied to a surface of the substrate to form a bond line and the semi-conductor component is placed on the bond line so that the paste is between the die and the substrate. This electronic assembly is then heated to a sufficiently high temperature for a sufficient time so that the thermoplastic resin softens and becomes fluid and the liquid evaporates from the paste. The assembly is cooled to a temperature below which the thermoplastic polymer becomes solid resulting in the bonding of the microcircuit to the substrate. The advantage of using this adhesive paste is that the bond line is void free. Voids in the bond line eventually can result in adhesion failure.

These pastes were tested as die attach compositions using 8.6 mm×8.6 mm (350 mil×350 mil) silicon dies (semi-conductor dies) on a ceramic substrate. However, these compositions have been shown to have limited utility on metal substrates or on larger die sizes, particularly for semi-conductor dies of sizes 400 mil×400 mil or greater. When these prior art adhesive pastes are used on dies of this size, and particularly on large size dies bonded to metal substrates, the dies delaminate or separate from the substrate after the curing cycle for the adhesive. The large die size makes it more difficult for the fugitive liquid to escape, which results in voids. Also, the difference between the coefficient of thermal expansion (CTE) of a metal substrate and that of the die is large. This mismatch of CTE places the adhesive bond between the die and substrate in constant stress and can result in die warpage and delamination. This combination of factors, large die size and metal substrate, almost inevitably lead to delamination of the die from the substrate.

Delamination is a critical problem, especially for those circuits that have high power, and consequently, high heat generating applications. In some instances, even if there is some delamination, the microcircuitry silicon chip or die will remain successfully bonded to the substrate. However, when there is a high heat output, even a minor amount of delamination from the substrate will detract from the ability of the adhesive to transfer the heat generated in the circuitry into the substrate. Eventually, this could result in device failure. Thus, there is still a need for improved adhesive compositions for use in attaching semi-conductor silicon dies, particularly large dies, to substrates, and particularly to metal substrates.

SUMMARY OF THE INVENTION

This invention is an improved adhesive composition prepared from at least one organic polymer resin, an inorganic filler, and a fugitive liquid, in which the liquid and organic polymer resin are each substantially insoluble in the other; and in which the improvement comprises that the at least one organic polymer resin be present in particulate form of particle size that is 25 µm or smaller. Adhesive compositions so prepared can be used on dies 400 mil×400 mil or greater on metal substrates without significant delamination.

A further embodiment of this invention is an electronic circuit assembly comprising a semi-conductor die of 400 mil×400 mil size or greater bonded to a substrate with an adhesive composition prepared from at least one organic polymer resin, an inorganic filler, and a fugitive liquid, in which the liquid and organic polymer resin are each substantially insoluble in the other; and in which the at least one organic polymer resin is present in particulate form of particle size that is 25 µm or smaller.

DETAILED DESCRIPTION OF THE INVENTION

For purposes of this specification, the organic polymer resin will be considered substantially insoluble in the fugitive liquid if the resin is not significantly soluble in the liquid, and if the liquid is not significantly soluble in the resin. Significantly soluble means less than 20 percent soluble, and preferably, less than 10 percent soluble.

The components of the improved adhesive composition of this invention are recited in U.S. Pat. No. 5,488,082, which is incorporated in full into this description by this reference. In brief, those components are organic polymer resins, inorganic fillers, and fugitive liquids that are not solvents for the polymer resins.

The polymer resins that can be used in this invention include any thermoset or thermoplastic organic polymer or any combination of thermoset and thermoplastic organic polymers that are suitable for the end use application desired. The preferred thermoplastic organic polymer will be a solid at temperatures from about room temperature up to the ambient temperature at which microcircuit electronic components operate, and one that softens upon heating to a temperature above the temperature at which microcircuit electronic components operate to become sufficiently fluid to create an adhesive bond between the components. The preferred thermoset organic polymer will have a melting or glass transition temperature between 35°–200° C., preferably between 50°–100° C., before cure, and a cure reaction onset temperature between 35°–200° C., preferably between 50°–150° C.; and after cure will harden to be a thermoset material that provides dimensional stability and heat resistance to the adhesive.

Exemplary and suitable thermoplastic polymers are poly (phenylene sulfides), poly(ether sulfones), polyamides, polyesters, polycarbonates, polysulfones, polyacetals, polyvinyl halides, polyofefins, halogenated polyofefins, acrylic polymers, vinyl polymers and thermoplastic epoxy resins. The polymers may also be copolymers of the thermoplastic polymers mentioned or copolymers of the thermoplastic polymers mentioned with other suitable thermoplastic polymers. Representative polyamides include poly (hexamethylene adipamide), poly(epsilon-caprolactam), poly(hexamethylene phthalamide and poly(isophthalamide). Representative polyesters include poly(ethylene terephthalate) and poly(butylene terephthalate).

The preferred thermoset polymers will be epoxies, although any of the thermoset polymers known and used in the particular end application may be used.

Suitable inorganic fillers are present in amounts up to 40 volume percent. Preferred inorganic fillers include silver, gold, copper, nickel, and alloys of those metals; alumina, beryllia, silica, silicon carbide, graphite, tungsten carbide, barium titanate, boron nitride, aluminum nitride, and diamond. For conductive die attach adhesives, the preferred filler is silver flakes, which typically are commercially available in particle sizes of 25 μm or less. It is preferred that any filler used have a particle size of 25 μm or less.

The fugitive liquid acts to suspend the organic polymer resin and inorganic fillers for convenient dispensing and application. The preferred liquids are nonpolar and have a room temperature vapor pressure of less than about 50 mm Hg and a low surface tension. Representative liquids are aliphatic and aromatic hydrocarbons, and glycol ethers and their derivatives.

The organic polymer or polymers will have a particle size of 25 μm or less. For reference of particle size in microns to mesh screen, a 45 μm particle corresponds approximately to a 325 mesh screen, a 40 μm particle corresponds approximately to a 400 mesh screen, and a 25 μm particle corresponds approximately to a 500 mesh screen. When the particle size is reduced to 25 μm or less, it has been unexpectedly discovered that large semi-conductor dies, 400 mil×400 mil or larger, can be attached to metal substrates without significant delamination from the substrate after being subjected to curing. The metal substrates are any of those currently used in the industry, such as copper, and silver-plated copper.

For purposes of this specification, significant delamination means more than 25% separation of the surface area of the die from the substrate. The curing generally takes place at temperatures in the range of 100°–200° C. When compositions having the same chemical composition, but particle sizes larger than 25 μm, are used, the 400 mil×400 mil dies demonstrate significant delamination from the substrate after curing cycle, that is greater than 25% delamination.

The adhesive compositions of this invention are prepared by mixing the components in equipment known in the art for paste preparation. The order of mixing is not critical: all the components can be blended together, or combinations of the components can be premixed, followed by addition of the remaining components to produce the paste. The prepared adhesive composition, before curing, will contain about 24–37 volume percent inorganic filler, and 11–37 volume percent, preferably 13–29 volume percent, organic polymer resin, with the remainder being the fugitive liquid and any additives.

In addition to the principal components mentioned, the adhesive composition may also contain minor amounts of additives such as adhesion promoters, thermal stabilizers, antioxidants, tackifiers, and viscosity modifying polymers. A preferred viscosity modifying polymer is styrene-b-ethylene (ethylene-co-propylene) block copolymer; similar copolymers as are known and used in the art, such as, (styrene-co-ethylene)-b-(butylene-co-styrene) block copolymers are also suitable. The choice and amount of additive will be known to those skilled in the art.

Adhesive compositions described in this specification may be used for attaching microcircuit electronic components to a substrate, and have been shown in the art to have sufficient bond strength for that purpose. The Examples show that the improved compositions of this invention demonstrate superior performance for large semi-conductor dies in that the dies do not separate from a metal substrate after the curing cycle for the adhesive.

EXAMPLES

Adhesive compositions were prepared according to the specification from the components recited in Table 1.

TABLE 1

| Component | Manufacturer and Product No. or Tradename | Volume Percentage in Composition |
| --- | --- | --- |
| Thermoplastic polyester | Bostik, Inc. 5164 | 5.3% |
| Thermoset polyester | Tomoegawa Paper Co. Ltd, P01CW06P | 16.8% |
| Hydrocarbon Solvent | Exxon Chemical Norpar 15 | 47.6% |
| Viscosity modifier | Shell Chemical Co. Kraton G1702 | 0.85% |
| Silver Flake | Degussa SF 80 | 14.74% |
| Silver Flake | Chemet LA113 | 14.74% |

Several samples of this formulation were made with variations in the particle size for the thermoset and thermoplastic polymer. The formulations were dispensed onto a silver-plated copper lead frame and 400 mil×400 mil dies and 500 mil×500 mil dies placed in contact with the adhesive. The number of dies tested for each formulation varied from five to fourteen.

The die and lead frame assemblies were placed in a programmable oven in which the temperature was ramped from 100° C. to 200° C. within 30 minutes, and then held at 200° C. for 15 minutes. The cured assemblies were removed from the oven and cooled to room temperature. Delamination was investigated using an Acoustic Microscope by Sonix, Inc., which instrument permits the observation of the level of interface delamination between the die and the substrate. The level of delamination is reported as a percentage of the total die area.

The particle sizes for the thermoset and thermoplastic polymers for each sample, the number of dies tested, and the incidences of delamination are reported in Table 2. The delamination is recorded as the number of dies out of the number tested that showed delamination and is divided into groups by percentage of interface delamination. For example, the entry "3/12" under "up to 75%" delamination means that 3 out of 12 dies showed delamination over an area of the interface between the die and the substrate of up to 75% of the interface.

TABLE 2

| | | Particle Size in microns | | Delamination | | |
| --- | --- | --- | --- | --- | --- | --- |
| Sample | Die Size mil × mil | Thermoset | Thermoplastic | 0% | up to 75% | >75% |
| A | 400 × 400 | <45 | <45 | 2/12 | 3/12 | 7/12 |
| B | 400 × 400 | 15–25 | <45 | 1/13 | 2/13 | 10/13 |

TABLE 2-continued

| Sample | Die Size mil × mil | Particle Size in microns Thermoset | Thermo-plastic | Delamination 0% | up to 75% | >75% |
|---|---|---|---|---|---|---|
| C | 400 × 400 | 15–25 | 15–25 | 14/14 | 0/14 | 0/14 |
| E | 400 × 400 | <15 | <15 | 11/11 | 0/11 | 0/11 |
| F | 500 × 500 | <5 | <15 | 11/11 | 0/11 | 0/11 |
| C | 500 × 500 | 15–25 | 15–25 | 0/5 | 0/5 | 5/5 |
| E | 500 × 500 | <15 | <15 | 1/5 | 1/5 | 3/5 |
| F | 500 × 500 | <5 | <15 | 5/5 | 0/5 | 0/5 |

The data show that the smaller particle size, 25 μm or less, gives superior results with respect to delamination of large dies on metal substrates.

We claim:

1. An improved adhesive composition prepared from at least one organic polymer resin, inorganic filler, and a fugitive liquid, in which the fugitive liquid and organic polymer resin are each substantially insoluble in the other; and in which the improvement comprises that the at least one organic polymer resin be present in particulate form of particle size that is 25 μm or smaller.

2. The adhesive composition according to claim 1 in which the organic polymer resin is a thermoplastic polymer, a thermoset polymer, or a combination of a thermoset and thermoplastic polymer.

3. The adhesive composition according to claim 2 in which the organic polymer resin is present in a volume percent in a range of 11–37%.

4. The adhesive composition according to claim 3 in which the thermoset resin and the thermoplastic resin have a particle size of <15 μm.

5. The adhesive composition according to claim 4 in which the thermoset resin has a particle size of <5 μm.

6. An electronic circuit assembly comprising a semiconductor die of 400 mil×400 mil size or greater bonded to a substrate with an adhesive composition prepared from at least one organic polymer resin, an inorganic filler, and a fugitive liquid, in which the liquid and organic polymer resin are each substantially insoluble in the other; and in which the at least one organic polymer resin is present in particulate form of particle size that is 25 μm or smaller.

7. The electronic circuit assembly of claim 6 in which the substrate is a metal substrate.

* * * * *